(12) United States Patent
Grynkewich et al.

(10) Patent No.: US 7,476,329 B2
(45) Date of Patent: Jan. 13, 2009

(54) METHODS FOR CONTACTING CONDUCTING LAYERS OVERLYING MAGNETOELECTRONIC ELEMENTS OF MRAM DEVICES

(75) Inventors: Gregory W. Grynkewich, Gilbert, AZ (US); Brian R. Butcher, Gilbert, AZ (US); Mark A. Durlam, Chandler, AZ (US); Kelly Kyler, Mesa, AZ (US); Charles A. Synder, Gilbert, AZ (US); Kenneth H. Smith, Chandler, AZ (US); Clarence J. Tracy, Tempe, AZ (US); Richard Williams, Chandler, AZ (US)

(73) Assignee: EverSpin Technologies, Inc., Chandler, AZ (US)

( * ) Notice: Subject to any disclaimer, the term of this patent is extended or adjusted under 35 U.S.C. 154(b) by 759 days.

(21) Appl. No.: 11/050,191

(22) Filed: Feb. 2, 2005

(65) Prior Publication Data

US 2005/0130374 A1   Jun. 16, 2005

Related U.S. Application Data

(62) Division of application No. 10/421,096, filed on Apr. 22, 2003, now Pat. No. 6,881,351.

(51) Int. Cl.
 *H01L 21/00* (2006.01)
(52) U.S. Cl. ............... 216/22; 216/41; 216/47; 216/72; 216/88; 438/3; 438/692; 438/696; 438/700

(58) Field of Classification Search ............... None
 See application file for complete search history.

(56) References Cited

U.S. PATENT DOCUMENTS

| | | | | | |
|---|---|---|---|---|---|
| 4,470,873 | A | * | 9/1984 | Nakamura | 216/22 |
| 6,165,803 | A | * | 12/2000 | Chen et al. | 438/3 |
| 6,440,753 | B1 | * | 8/2002 | Ning et al. | 438/3 |
| 6,734,079 | B2 | * | 5/2004 | Huang et al. | 438/396 |
| 6,806,096 | B1 | * | 10/2004 | Kim et al. | 438/3 |
| 2003/0219944 | A1 | * | 11/2003 | Kato et al. | 438/257 |

* cited by examiner

*Primary Examiner*—Anita K Alanko
(74) *Attorney, Agent, or Firm*—Ingrassia Fisher & Lorenz, P.C.

(57) ABSTRACT

A method for contacting an electrically conductive layer overlying a magnetoelectronics element includes forming a memory element layer overlying a dielectric region. A first electrically conductive layer is deposited overlying the memory element layer. A first dielectric layer is deposited overlying the first electrically conductive layer and is patterned and etched to form a first masking layer. Using the first masking layer, the first electrically conductive layer is etched. A second dielectric layer is deposited overlying the first masking layer and the dielectric region. A portion of the second dielectric layer is removed to expose the first masking layer. The second dielectric layer and the first masking layer are subjected to an etching chemistry such that the first masking layer is etched at a faster rate than the second dielectric layer. The etching exposes the first electrically conductive layer.

15 Claims, 4 Drawing Sheets

METHODS FOR CONTACTING CONDUCTING LAYERS OVERLYING MAGNETOELECTRONIC ELEMENTS OF MRAM DEVICES

RELATED APPLICATION

This application is a divisional of Application Ser. No. 10/421,096, filed Apr. 22, 2003 now U.S. Pat. No. 6,881,351.

FIELD OF THE INVENTION

The present invention generally relates to magnetoelectronics devices, and more particularly to methods for contacting electrically conducting layers overlying magnetoelectronics elements of magnetoresistive random access memory devices.

BACKGROUND OF THE INVENTION

Magnetoelectronics devices, spin electronics devices and spintronics devices are synonymous terms for devices that use the effects predominantly caused by electron spin. Magnetoelectronics effects are used in numerous information devices, and provide non-volatile, reliable, radiation resistant, and high-density data storage and retrieval. Magnetoresistive random access memory (MRAM) devices are well-known magnetoelectronics information devices.

Generally, a magnetoelectronics information device is constructed with an array of magnetoelectronics elements (e.g., giant magnetoresistance (GMR) elements or magnetic tunnel junction (MTJ) elements) that are separated by dielectric or other insulative material. One type of electrical connection to a magnetoelectronics element is made using electrically conductive layers or electrodes that overlie the element. However, inherent stress in the structure of the electrodes can adversely affect the magnetic properties of the magnetoelectronics element. Accordingly, it is preferable to make at least the overlying contact electrode as thin as possible. However, as the thickness of the overlying contact electrode decreases, the difficulty in making subsequent electrical contact to the overlying contact electrode increases. Planarization to the overlying contact electrode often results in over-planarization past the overlying contact electrode. In addition, planarization to an array of overlying contact electrodes may result in "edge effects" which damage the magnetoelectronics elements disposed on the outside of the array Further, the creation of a via to an overlying electrode is difficult with present-day increases in aspect ratios and requires additional masking steps, resulting in decreased throughput and increased production costs.

Accordingly, it is desirable to provide an improved method for contacting an electrically conductive layer overlying a magnetoelectronics element. It is also desirable to provide an improved method for contacting an electrically conductive layer overlying a magnetoelectronics element in an array of magnetoelectronics elements. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
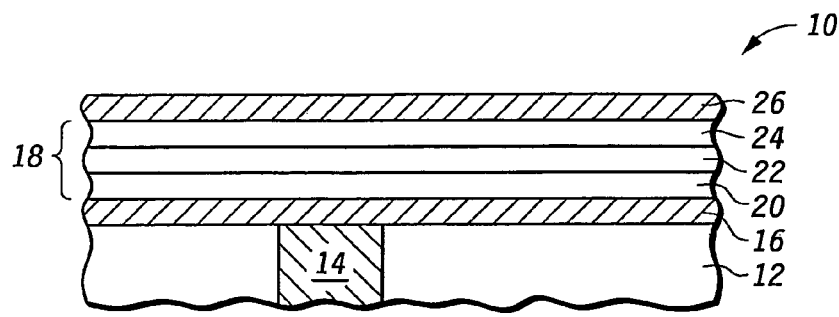
FIGS. 1-7 illustrate schematically, in cross section, a method for contacting an electrically conducting layer overlying a magnetoelectronics element of an MRAM device in accordance with an exemplary embodiment of the invention.

Turning now to the figures, FIGS. 1-7 illustrate a method in accordance with one exemplary embodiment of the present invention for contacting an electrically conducting layer overlying a magnetoelectronics element of an MRAM device. FIG. 1 is a cross-sectional view of partially fabricated magnetoelectronics element structure 10 of an MRAM device. The method begins by providing a dielectric region 12 having a conductor 14 formed therein. Dielectric region 12 can be formed of any suitable dielectric material, such as, for example, silicon dioxide ($SiO_2$). Conductor 14 may comprise any suitable conductive material, such as aluminum (Al), aluminum alloys, copper (Cu) and copper alloys, and may include barrier materials such as, for example, tantalum (Ta), tantalum nitride (TaN), titanium (Ti), titanium nitride (TiN), or titanium tungsten (TiW). While not shown, conductor 14 typically is electrically connected, such as by a plug conductor or a series of conductors in an interconnect stack, to a transistor formed in a semiconductor substrate, such as a silicon substrate. The transistors are used to access the contents of the magnetoelectronics elements in reading operations. In addition, dielectric region 12 may comprise a plurality of programming lines (not shown), typically known as digit lines, each of which provides a magnetic field for programming of subsequently-formed magnetoelectronics elements.

In one exemplary embodiment of the invention, a first conductive layer 16 is deposited overlying dielectric region 12 and conductor 14 and is in electrical communication with conductor 14. As used herein, the term "layer" means one layer or a combination or plurality of layers or sub-layers. First conductive layer 16 can be formed of any suitable electrically conductive material. Preferably, first conductive layer 16 is formed of tantalum (Ta), tungsten (W), titanium (Ti), aluminum (Al), tantalum nitride (TaN) or combinations or alloys thereof. More preferably, first conductive layer 16 is formed of tantalum.

A memory element layer 18 then is deposited overlying first conductive layer 16. Memory element layer 18 comprises materials that form the memory element, such as an MTJ element or a GMR element. In one exemplary embodiment of the present invention, the memory element comprises an MTJ element and memory element layer 18 comprises a first magnetic layer (or combination of layers) 20, a tunnel barrier layer (or combination of layers) 22, and a second magnetic layer (or combination of layers) 24, which may be deposited overlying first conductive layer 16 using methods such as, for example, physical vapor deposition (PVD), ion beam deposition, and the like. First and second magnetic layers 20 and 24 may comprise any number of magnetic materials, such as nickel (Ni), iron (Fe), cobalt (Co) or alloys thereof. Alternatively, first and second magnetic layers 20 and 24 may comprise a composite magnetic material, such as nickel-iron (NiFe), nickel-iron-cobalt (NiFeCo) or cobalt-iron (CoFe) or alloys thereof, for example. Additionally, first and second magnetic layers 20 and 24 may comprise other materials, such as platinum (Pt), iridium (Ir), manganese (Mn), aluminum (Al), ruthenium (Ru), osmium (Os) or tantalum (Ta) or combinations or alloys thereof. Tunnel barrier layer 22 preferably comprises aluminum oxide ($AlO_x$, where $0<x\leq1.5$), but any number of insulators or semiconductors, such as aluminum nitride or oxides of nickel, iron, cobalt or alloys thereof, can be used in accordance with the present invention. First magnetic layer 20 serves as a hard magnetic layer, magnetization in which is pinned or fixed, whereas magnetization directions in second magnetic layer 24 are free to be switched between two magnetic states. Tunnel barrier layer 22 may be formed by the following methods. An aluminum film is deposited over first magnetic layer 20, then the aluminum film is oxidized by an oxidation source, such as RF oxygen plasma. As another method, aluminum is deposited together with oxide on first magnetic layer 20, and then oxidation is carried out in oxygen ambient either heated or unheated. First and second magnetic layers 20 and 24 have thicknesses in the range from approximately 5 to 500 angstroms. The thickness of tunnel barrier layer 22 ranges from about 5 to 30 angstroms.

In another exemplary embodiment, because first magnetic layer 20 typically comprises an electrically conductive material, first magnetic layer 20 may be deposited on dielectric region 12 and may be in electrical contact with conductor 14.

After deposition of second magnetic layer 24, a second conductive layer 26 is deposited overlying second magnetic layer 24. Second conductive layer 26 can be formed of any suitable electrically conductive materials. Preferably, second conductive layer 26 is formed of tantalum (Ta), tungsten (W), titanium (Ti), aluminum (Al), tantalum nitride (TaN) or combinations or alloys thereof. More preferably, second conductive layer 26 is formed of tantalum.

Figure 2:
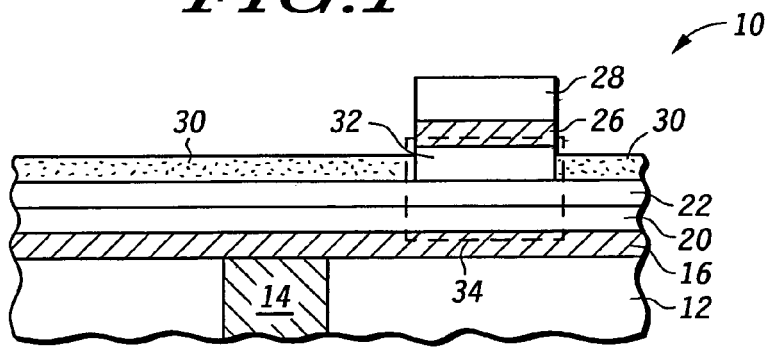

Referring to FIG. 2, a dielectric material is deposited overlying second conductive layer 26 and is patterned using standard and well-known techniques to form a first masking layer 28. Preferably, first masking layer 28 is made of any suitable dielectric material, such as, for example, tetraethyl orthosilicate-derived silicon dioxide (TEOS), plasma-enhanced nitride (PEN), silicon nitride ($Si_3N_4$), silicon dioxide, and the like.

Second conductive layer 26 then is etched such that its lateral dimensions correspond to the lateral dimensions of first masking layer 28. Second conductive layer 26 may be etched using a suitable etching process, such as a dry etch, an ion milling process, reactive ion etching (RIE), or the like.

Second magnetic layer 24 may be partially etched using a dry etch and the remaining exposed portion of second magnetic layer 24 is changed into a material containing dielectric properties utilizing either oxidation or nitridation techniques. More specifically, the exposed portion of second magnetic layer 24 is transformed into an insulative portion 30. During the process of transforming the exposed portion of second magnetic layer 24 into an insulative portion 30, first masking layer 28 protects the unexposed portion of second magnetic layer 24 so that, after the oxidation or nitridation takes place, an active portion 32 is defined, which remains metallic, and an inactive portion, or dielectric insulator 30 is defined where the now-insulative portion is located. Additional information regarding the oxidation and nitridation of magnetic materials to form insulative materials can be found in U.S. Pat. No. 6,165,803, entitled "Magnetic Random Access Memory and Fabrication Method Thereof," issued Dec. 26, 2000, and incorporated in its entirety herein by reference. The lateral dimensions of the active portion 32 correspond to the lateral dimensions of a concurrently formed MTJ element 34, which comprises active portion 32, tunnel barrier layer 22 and first magnetic layer 20.

In an alternative exemplary embodiment of the invention, the exposed portion of second magnetic layer 24 may be transformed as described above without the partial etching of second magnetic layer 24 if second magnetic layer 24 is sufficiently thin so that the exposed portion of second magnetic layer 24 is rendered insulative upon oxidation or nitridation.

Figure 3:
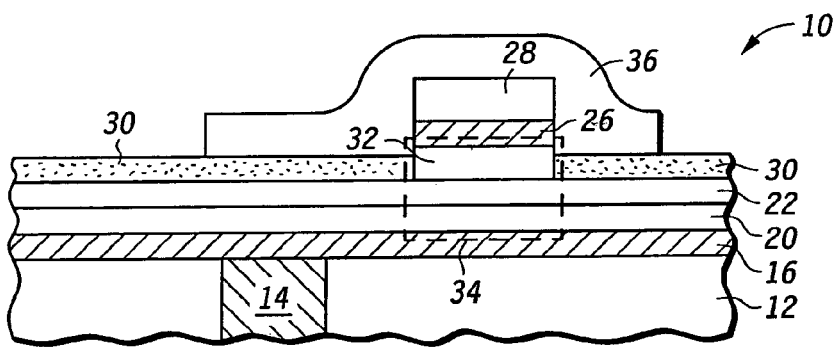

Referring to FIG. 3, in an exemplary embodiment of the invention, a blanket dielectric layer is deposited globally overlying magnetoelectronics element structure 10 and is patterned and etched using standard and well known techniques to form second masking layer 36. Second masking layer 36 may be formed of any of the materials that form first masking layer 28 and may be formed of the same material that comprises first masking layer 28. In a preferred embodiment of the invention, second masking layer 36 is formed of a material that is different from first masking layer 28 such that when first masking layer 28 and second masking layer 36 are subjected to an etch chemistry, first masking layer 28 is etched faster than second masking layer 36. For example, in one exemplary embodiment of the invention, first masking layer 28 may comprise PEN and second masking layer 36 may comprise TEOS. Formation of second masking layer 36 results in exposed portions of insulative portion 30 of second magnetic layer 24, tunnel barrier 22, first magnetic layer 20 and first electrically conductive layer 16.

Figure 4:
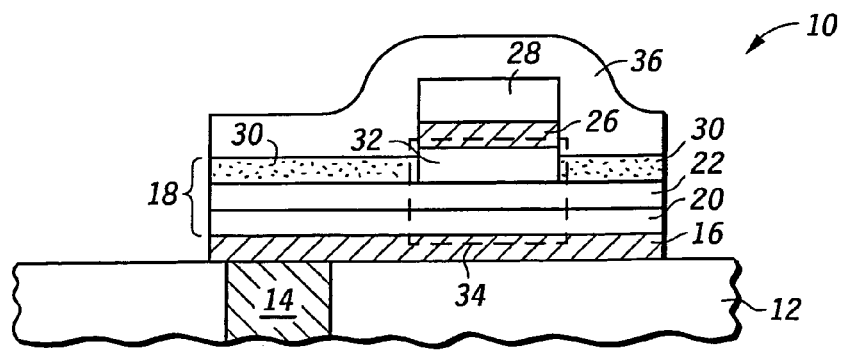

Referring to FIG. 4, the remaining exposed portions of inactive insulative portion 30, tunnel barrier 22, and first magnetic layer 20 may be etched, preferably using a dry etch, an ion milling process or RIE. The lateral edges of layers 30, 22, and 20 are defined by the lateral edges of second masking layer 36. In another exemplary embodiment of the present invention, the remaining exposed portion of first conductive layer 16 also may be etched. It will be appreciated that the lateral edges of second masking layer 36 are such that first conductive layer 16 maintains electrical communication with conductor 14 after etching of first conductive layer 16.

Figure 5:
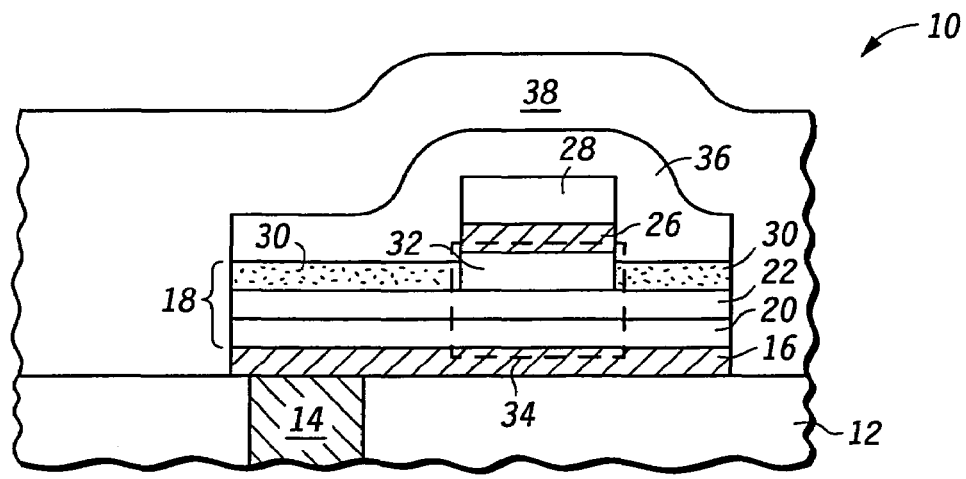

Referring to FIG. 5, a blanket dielectric layer 38 is deposited globally overlying magnetoelectronics element structure 10. Dielectric layer 38 may be formed of any suitable dielectric material and preferably is formed of a material different from first masking layer 28 such that when first masking layer 28 and dielectric layer 38 are subjected to an etch chemistry, first masking layer 28 is etched faster than dielectric layer 38. For example, in one exemplary embodiment of the invention, first masking layer 28 may comprise PEN and dielectric layer 38 may comprise TEOS.

Figure 6:
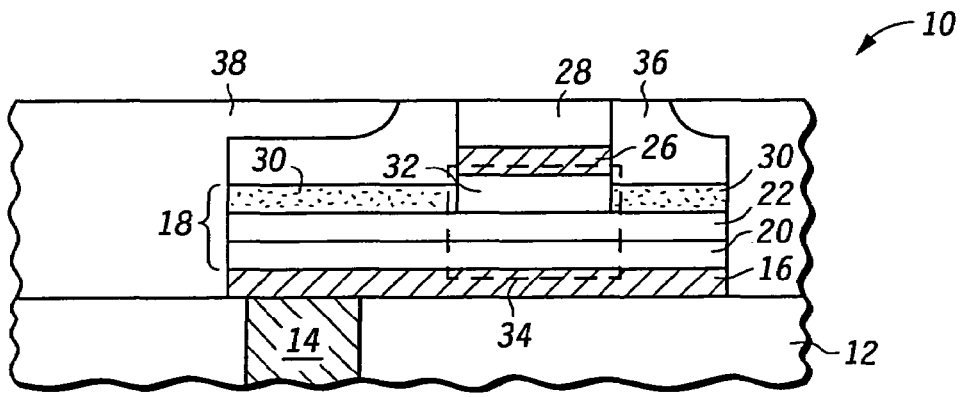

Referring to FIG. 6, a portion of dielectric layer 38 and a portion of second masking layer 36 may be removed using any suitable planarization process known in the semiconductor industry, such as, for example, chemical mechanical polishing (CMP) or electrochemical mechanical polishing (ECMP), or any other suitable removal process, such as etching, to expose first masking layer 28.

Figure 7:
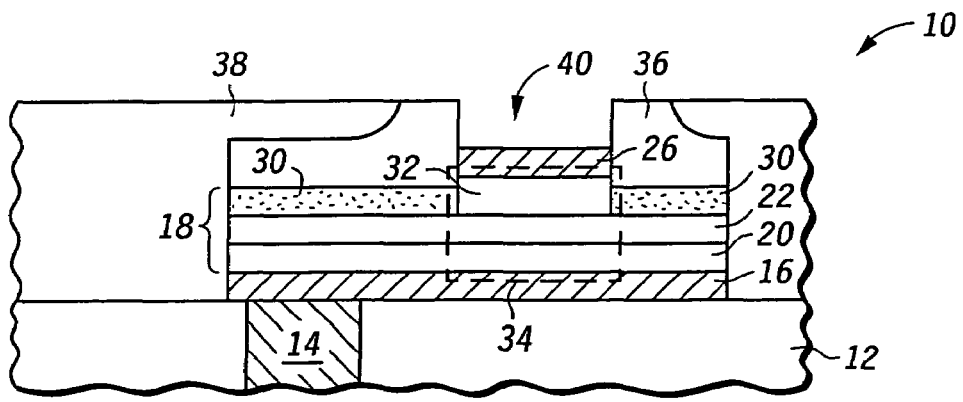

Referring to FIG. 7, magnetoelectronics element structure 10 then may be subjected to an etch chemistry, preferably a dry etch, causing first masking layer 28 to be etched faster than dielectric layer 38 so that a via 40 is formed that at least partially exposes second conductive layer 26. In a preferred embodiment of the invention, first masking layer 28 is etched faster than second masking layer 36 and dielectric layer 38 forming via 40 that at least partially exposes second conductive layer 26. Etching is continued until at least a sufficient amount of the surface of second conductive layer 26 is exposed so that electrical communication between second conductive layer 26 and a conductive layer subsequently deposited overlying second conductive layer 26 can be established.

Figure 8:
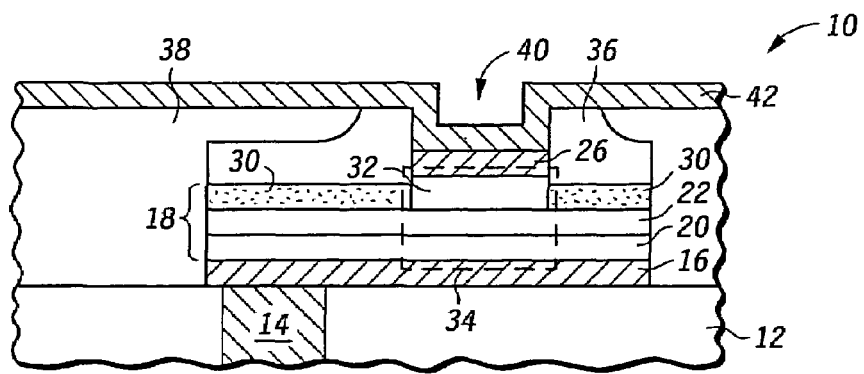
FIG. 8 illustrates schematically, in cross section, a method for contacting an electrically conducting layer overlying a magnetoelectronics element of an MRAM device in accordance with another exemplary embodiment of the invention.

Referring to FIG. 8, in one exemplary embodiment of the present invention, after via 40 is formed and second conductive layer 26 is at least partially exposed, an interconnect layer 42 may be deposited overlying second conductive layer 26. Interconnect layer 42 may comprise any suitable electrically conductive material. Interconnect layer 42 may establish electrical communication between MTJ element 34 and another electronically active element of the MRAM device, such as, for example, another MTJ element that is in electrical communication with interconnect layer 42.

Figure 9:
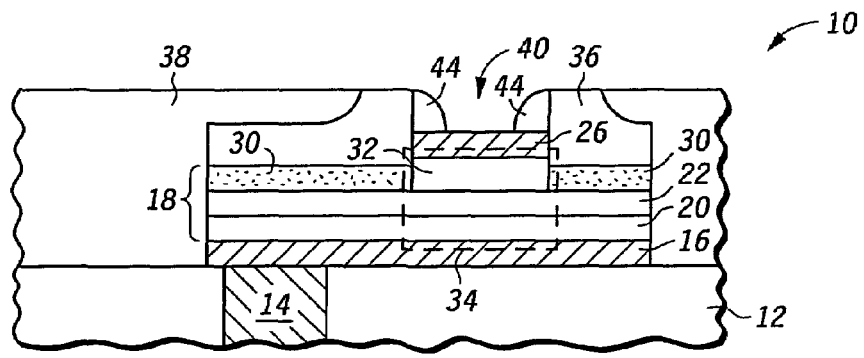
FIG. 9 illustrates schematically, in cross section, a method for contacting an electrically conducting layer overlying a magnetoelectronics element of an MRAM device in accordance with a further exemplary embodiment of the invention.

Referring to FIG. 9, in another exemplary embodiment, if desirable because of poor step coverage of interconnect layer 42, it may be beneficial to form a spacer within via 40 before deposition of interconnect layer 42. In this embodiment, after via 40 is formed and second conductive layer 26 is suitably exposed, a third masking layer (not shown) may be deposited overlying magnetoelectronics element structure 10. The third masking layer may comprise any suitable dielectric material and may have a thickness in the range of approximately 500 to 3000 angstroms. The third masking layer may be etched to suitably expose second conductive layer 26 and simultaneously form a spacer 44 within via 40 to narrow via 40. After formation of spacer 44, an electrically conductive layer, such as interconnect layer 42 described above, may be deposited overlying second conductive layer 26 so that electrical communication can be established between MTJ element 34 and another electrically active element of the MRAM device.

It will be understood that, while the foregoing embodiments have been described and illustrated with reference to the formation of an MTJ element, it is not intended that the invention be limited to such illustrative embodiments. Rather, it will be appreciated that the methods of the present invention can be used to contact the electrically conducting layers overlying any suitable magnetoelectronics element of an MRAM device, such as, for example, a GMR element or an MTJ element.

Figure 10:
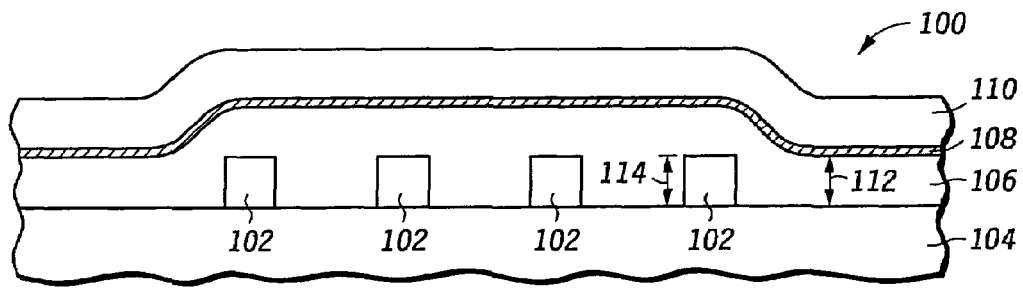
FIGS. 10-13 illustrate schematically, in cross section, a method for contacting an electrically conducting layer overlying a magnetoelectronics element of an array of magnetoelectronics elements of an MRAM device in accordance with an exemplary embodiment of the invention.

FIGS. 10-13 illustrate a method in accordance with another exemplary embodiment of the present invention for contacting a conducting layer overlying a magnetoelectronics element of an array of magnetoelectronics elements of an MRAM device. FIG. 10 is a cross-sectional view of a partially fabricated MRAM device structure 100 having an array of magnetoelectronics elements 102, such as, for example, giant magnetoresistance (GMR) elements or magnetic tunnel junction (MTJ) elements, formed over a dielectric region 104. Dielectric region 104 can be formed of any suitable dielectric material, such as, for example, silicon dioxide ($SiO_2$). While not shown, dielectric region 104 typically comprises a plurality of conductors. Each magnetoelectronics element 102 may be in electrical communication through a conductor to a transistor formed in a semiconductor substrate (not shown), such as a silicon substrate. The transistors are used to switch the magnetoelectronics elements 102 in reading operations. In addition, dielectric region 104 may comprise a plurality of digit lines (not shown), each of which is magnetically coupled to a magnetoelectronics element 102 and which provides a magnetic field for programming of the magnetoelectronics element.

A first dielectric layer 106 is deposited overlying the array of magnetoelectronics elements 102. First dielectric layer 106 may be formed of any suitable dielectric material or materials such as, for example, tetraethyl orthosilicate-derived silicon dioxide (TEOS), plasma-enhanced nitride (PEN), silicon nitride ($Si_3N_4$), silicon dioxide, and the like. In one exemplary embodiment of the invention, a thickness 112 of first dielectric layer 106 deposited overlying dielectric region 104 is approximately at least as great as a height 114 of magnetoelectronics elements 102. In a preferred embodiment of the invention, thickness 112 of first dielectric layer is approximately equal to the height 114 of magnetoelectronics elements 102.

An etch stop layer 108 is deposited overlying first dielectric layer 106. Etch stop layer 108 may be formed of any suitable etch stop material known and used in the semiconductor industry, such as material that is selective to fluorine (F)-based chemistries, or etch stop layer 108 may be formed of a material that provides an endpoint signal for stopping the etch process. Examples of suitable etch stop materials to provide the desired etch selectivity include TEOS, PEN, aluminum oxide ($AlO_x$, where $0<x\leq1.5$) and aluminum nitride (AlN) with a thickness in a range of approximately 100 angstroms to 500 angstroms, or a silicon nitride or silicon oxy-nitride (SiON) layer can be used to provide an endpoint signal.

A second dielectric layer 110 is deposited overlying etch stop layer 108. Second dielectric layer 110 may be formed of any suitable dielectric material or materials such as, for example, TEOS, PEN, silicon nitride, silicon dioxide, and the like. Preferably, second dielectric layer 110 is formed of a material different from that comprising etch stop layer 108 such that etch stop layer 108 is etched at a slower rate than second dielectric layer 110 when MRAM device structure 100 is subjected to an etch chemistry. In a more preferred embodiment of the invention, second dielectric layer 110 is formed from TEOS and etch stop layer 108 comprises PEN.

Figure 11:
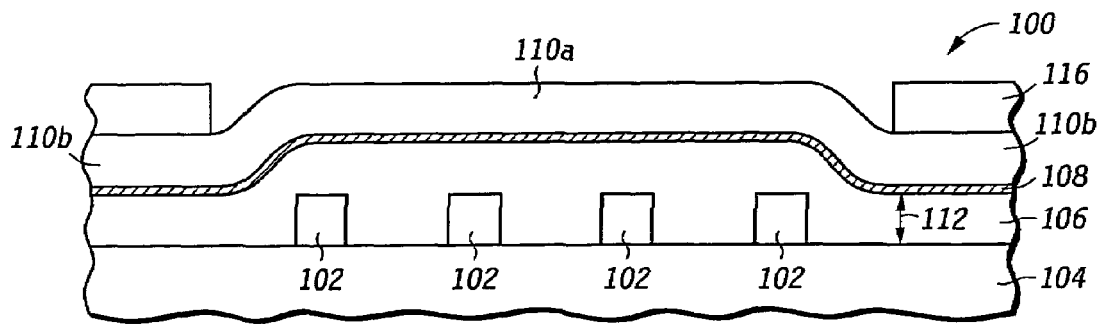

Referring to FIG. 11, a masking layer 116 is deposited overlying second dielectric layer 110 and is patterned using standard processes well-known and used in the semiconductor industry. In a preferred embodiment of the invention, masking layer 116 is a photoresist layer that is developed using standard photolithographic process, although it will be appreciated that masking layer 116 may comprise any other material suitable for forming a patterned masking layer overlying second dielectric layer 110. Masking layer 116 may be disposed about the periphery of the array of magnetoelectronics elements 102 and may be patterned so as to be interposed between two or more magnetoelectronics elements 102. The disposition of masking layer 116 is dependent on a variety of factors specific to MRAM device structure 100, including, but not limited to, the size of magnetoelectronics elements 102, the distance of magnetoelectronics elements 102, the distance of magnetoelectronics elements 102 from each other, the thickness of layers 106, 108 and 110, and the step coverage of layers 106 and 110. Patterning of masking layer 116 results in the formation of an exposed portion 110a of second dielectric layer 110.

Figure 12:
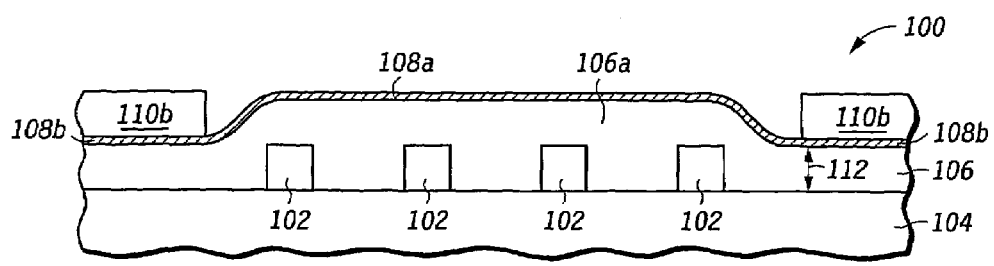
Figure 13:
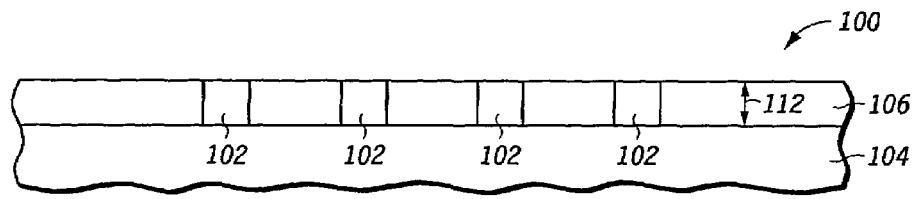

Referring to FIGS. 12-13, after deposition and patterning of masking layer 116, exposed portion 110a of second dielectric layer 110 may be removed, such as by wet or dry etching, thus exposing a portion 108a of etch stop layer 108. Masking layer 116 then may be removed using standard semiconductor processing to expose a remaining portion 110b of second dielectric layer 110.

In one exemplary embodiment of the invention, exposed portion 108a of etch stop layer 108 may be removed using an etching chemistry that is suitable for the composition of etch stop layer 108. Removal of exposed portion 108a of etch stop layer 108 exposes a portion 106a of first dielectric layer 106 that overlies the array of memory elements 102. All or substantially all of remaining portion 110b of second dielectric layer 110 and exposed portion 106a of first dielectric layer 106 then may be removed using any suitable planarization process known in the semiconductor industry, such as, for example, chemical mechanical polishing (CMP) or electrochemical mechanical polishing (ECMP), or any other suitable removal process, such as etching. Any remaining exposed etch stop layer 108 may be removed using a suitable etching chemistry. Depending on the thickness 112 of first dielectric layer 106, remaining portion 110b of second dielectric layer 110 may not be completely removed. In an alternative embodiment of the invention, exposed portion 108a of etch stop layer 108 may be removed during planarization of remaining portion 110b of second dielectric layer 110 and exposed portion 106a of first dielectric layer 106. As shown in FIG. 13, portion 106a of first dielectric layer 106 is removed to expose the conducting surfaces of magnetoelectronics elements 102 to enable subsequent electrical contact.

In another exemplary embodiment of the invention, etch stop layer 108 may be formed of a material that provides an endpoint signal for stopping or slowing the planarization process. In this embodiment, exposed portion 108a of etch stop layer 108 may be removed using an etching chemistry that is suitable for the composition of etch stop layer 108. Remaining portion 110b of second dielectric layer 110 and the exposed portion 106a of first dielectric layer 106 then may be removed using a suitable planarization process. The planarization process is slowed or halted when a remaining portion 108b of etch stop layer 108 is exposed upon removal of remaining portion 110b of second dielectric layer 110. In one exemplary embodiment of the invention, second dielectric layer 110 may be formed from TEOS and etch stop layer 108 may comprise PEN. Any remaining exposed etch stop layer 108, including remaining portion 108b, then may be removed using a suitable etching chemistry.

Figure 14:
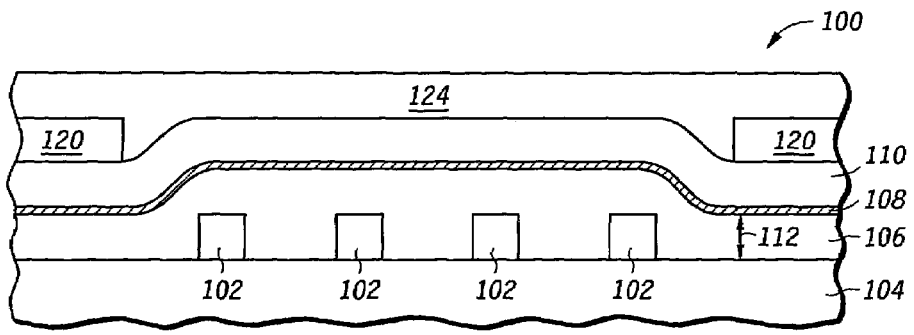
FIGS. 14-15 illustrate schematically, in cross section, a method for contacting an electrically conducting layer overlying a magnetoelectronics element of an array of magnetoelectronics elements of an MRAM device in accordance with another exemplary embodiment of the invention.
Figure 15:
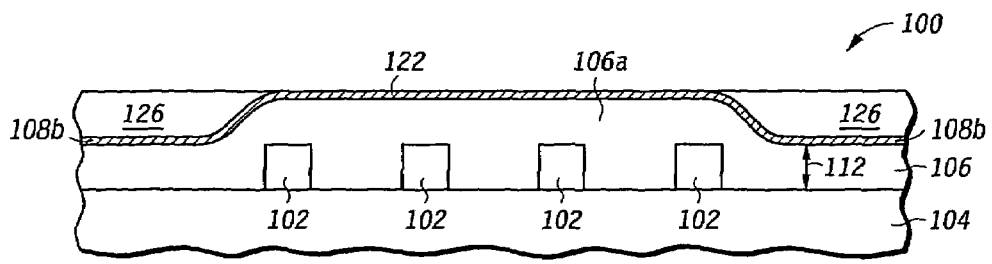

Referring to FIGS. 14 and 15, in yet another exemplary embodiment of the invention, after deposition of second dielectric layer 110, a planarization layer 120 may be deposited overlying second dielectric layer 110 and may be patterned and etched according to standard semiconductor processing using a method described above for patterning masking layer 116. In a preferred embodiment of the invention, planarization layer 120 comprises photoresist. A recoat layer 124 then may be deposited overlying MRAM device structure 100. Preferably, recoat layer 124 is a photoresist layer, although recoat layer 124 also may comprise any other suitable material, such as, for example, spin-on glass. Recoat layer 124, planarization layer 120, and a portion of second dielectric layer 110 overlying the array of magnetoelectronics elements 102 are removed using any suitable method, such as, preferably, wet or dry etching, to expose a surface 122 of etch stop layer 108. In the preferred embodiment, the etching is performed in a manner such that recoat layer 124, planarization layer 120 and second dielectric layer 110 are etched at substantially the same rate. The etching results in a remaining portion 126 of second dielectric layer 110 overlying a portion of etch stop layer 108 but coplanar with surface 122. Surface 122 of etch stop layer 108 may be removed using an etching chemistry that is suitable for the composition of etch stop layer 108. Remaining portion 126 of second dielectric layer 110 and portion 106a of first dielectric layer 106 then may be removed using any suitable planarization process known in the semiconductor industry, such as, for example, CMP, ECMP, or any other suitable removal process, such as etching, thus resulting in the structure illustrated in FIG. 13. Again, as shown in FIG. 13, portion 106a of first dielectric layer 106 is removed to expose the conducting surfaces of magnetoelectronics elements 102 to enable subsequent electrical contact. As described above, in one exemplary embodiment of the invention, etch stop layer 108 may be formed of a material that provides an endpoint signal for stopping or slowing the planarization process. Accordingly, the planarization process may be slowed or halted when remaining portion 108b of etch stop layer 108 is exposed upon removal of remaining portion 126 of second dielectric layer 110. Any remaining exposed etch stop layer 108, including remaining portion 108b, then may be removed using a suitable etching chemistry. Depending on the thickness 112 of first dielectric layer 106, remaining portion 126 of second dielectric layer 110 and remaining portion 108b of etch stop layer 108 may not be completely removed.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method for contacting an electrically conductive layer overlying a magnetoelectronics element in an array of magnetoelectronics elements, the method comprising the steps of:
   forming an array of magnetoelectronics elements on a dielectric region, said magnetoelectronics elements having electrically conductive layers formed thereon;
   depositing a conformal first dielectric layer overlying said array of magnetoelectronics elements and said dielectric region;
   depositing an etch stop layer overlying said first dielectric layer;
   depositing a second dielectric layer overlying said etch stop layer;
   patterning said second dielectric layer and etching a portion of said second dielectric layer to form a contiguous exposed portion of said etch stop layer overlying said array of magnetoelectronics elements; and
   removing said exposed portion of said etch stop layer and a portion of said first dielectric layer to expose said electrically conductive layers.

2. The method of claim 1, wherein said step of depositing a second dielectric layer comprises depositing a second dielectric layer formed of a material different from a material comprising said etch stop layer so that when said second dielectric layer and said etch stop layer are subjected to an etching chemistry, said etch stop layer is etched at a slower rate than said second dielectric layer.

3. The method of claim 2, wherein said step of depositing a second dielectric layer comprises depositing a second dielectric layer formed of tetraethyl orthosilicate-derived silicon dioxide and the step of depositing an etch stop layer comprises depositing an etch stop layer formed of plasma-enhanced nitride.

4. The method of claim 1, wherein said step of depositing a first dielectric layer comprises depositing said first dielectric layer to a thickness as measured from said dielectric region that is approximately equal to a height of a magnetoelectronic element of said array of magnetoelectronic elements as measured from said dielectric region.

5. The method of claim 1, said step of removing said exposed portion of said etch stop layer and a portion of said first dielectric layer comprising etching said exposed portion of said etch stop layer and removing said portion of said first dielectric layer by a planarization process.

6. The method of claim 5, the step of depositing an etch stop layer comprising depositing said etch stop layer formed of a material that provides an endpoint signal for one of stopping and slowing said planarization process.

7. A method for contacting an electrically conductive layer overlying a magnetoelectronics element in an array of magnetoelectronics elements, the method comprising the steps of:
   forming an array of magnetoelectronics elements on a dielectric region, said magnetoelectronics elements having electrically conductive layers formed thereon;
   depositing a first dielectric layer overlying said array of magnetoelectronics elements and said dielectric region;
   depositing an etch stop layer overlying said first dielectric layer;
   depositing a second dielectric layer overlying said etch stop layer;
   depositing and patterning a planarization layer overlying said second dielectric layer;
   forming a recoat layer overlying said patterned planarization layer and said second dielectric layer;
   removing substantially all of said recoat layer, substantially all of said planarization layer, and a portion of said second dielectric layer to expose a surface of said etch stop layer; and
   removing said exposed portion of said etch stop layer and a portion of said first dielectric layer to expose said electrically conductive layers.

8. The method of claim 7, wherein said step of removing substantially all of said recoat layer, substantially all of said planarization layer, and a portion of said second dielectric layer comprises removing by one of wet etching and dry etching.

9. The method of claim 7, wherein the step of removing said exposed portion of said etch stop layer and a portion of said first dielectric layer comprises removing by one of chemical mechanical polishing, electrochemical mechanical polishing and etching.

10. The method of claim 7, said step of removing said exposed portion of said etch stop layer and a portion of said first dielectric layer comprising etching said exposed portion of said etch stop layer and removing said portion of said first dielectric layer by a planarization process.

11. The method of claim 10, the step of depositing an etch stop layer comprising depositing said etch stop layer formed of a material that provides an endpoint signal for one of stopping and slowing said planarization process.

12. The method of claim 7, said step of depositing and patterning a planarization layer comprising depositing a photoresist layer.

13. The method of claim 7, the step of forming a recoat layer comprising forming a recoat layer of photoresist material.

14. The method of claim 7, wherein said step of depositing a second dielectric layer comprises depositing a second dielectric layer formed of a material different from a material comprising said etch stop layer so that when said second dielectric layer and said etch stop layer are subjected to an etching chemistry, said etch stop layer is etched at a slower rate than said second dielectric layer.

15. The method of claim 7, wherein said step of removing substantially all of said recoat layer, substantially all of said planarization layer, and a portion of said second dielectric layer comprises etching said recoat layer, said planarization layer, and said portion of said second dielectric layer at substantially the same rate.

* * * * *